(12) United States Patent
Danel et al.

(10) Patent No.: US 8,552,367 B2
(45) Date of Patent: Oct. 8, 2013

(54) MICRO-REFLECTRON FOR TIME-OF-FLIGHT MASS SPECTROMETER

(75) Inventors: Jean-Sebastien Danel, Echirolles (FR); Laurent Duraffourg, Voiron (FR); Frederic Progent, Paris (FR); Charles-Marie Tassetti, Paris (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/366,701

(22) Filed: Feb. 6, 2012

(65) Prior Publication Data
US 2012/0199736 A1 Aug. 9, 2012

(30) Foreign Application Priority Data
Feb. 7, 2011 (FR) .................................... 11 50971

(51) Int. Cl.
*H01J 49/00* (2006.01)
(52) U.S. Cl.
USPC .......................................................... 250/287
(58) Field of Classification Search
USPC ................. 250/281, 282, 287, 299
See application file for complete search history.

(56) References Cited

U.S. PATENT DOCUMENTS

| | | | | |
|---|---|---|---|---|
| 5,814,813 | A * | 9/1998 | Cotter et al. ................. | 250/287 |
| 6,570,152 | B1 * | 5/2003 | Hoyes .......................... | 250/287 |
| 7,154,086 | B2 * | 12/2006 | Laprade ....................... | 250/287 |
| 7,282,709 | B2 * | 10/2007 | Darling et al. ............... | 250/299 |
| 7,605,377 | B2 * | 10/2009 | Verbeck et al. ........... | 250/396 R |
| 2003/0071208 | A1 * | 4/2003 | Hansen ....................... | 250/287 |
| 2003/0230726 | A1 * | 12/2003 | Van der Veer et al. .... | 250/396 R |
| 2009/0140140 | A1 * | 6/2009 | Raznikov et al. ............ | 250/287 |
| 2009/0272891 | A1 * | 11/2009 | Giles ............................ | 250/282 |
| 2009/0309015 | A1 * | 12/2009 | Schultz et al. ............... | 250/281 |
| 2010/0072363 | A1 * | 3/2010 | Giles et al. .................... | 250/287 |
| 2010/0090098 | A1 * | 4/2010 | Laprade ....................... | 250/281 |
| 2011/0031388 | A1 * | 2/2011 | Bower et al. .................. | 250/281 |

OTHER PUBLICATIONS

Roman P.A. et al., "A Miniature MEMS and NEMS enabled Time-of-Flight Mass Spectrometer for Investigations in Planetary Science," vol. 6959, Jan. 1, 2008, pp. 69590G-69590G-13.
King, Todd T. et al., "Simulation of a Miniature, Low-Power Time-of-Flight Mass Spectrometer for In Situ Analysis of Planetary Atmospheres," vol. 6959, Jan. 1, 2008, pp. 69590E-69590E-15.
International Search Report for International Application No. FR 1150971, dated Oct. 7, 2011, 2 pages.

* cited by examiner

*Primary Examiner* — Robert Kim
*Assistant Examiner* — Jason McCormack
(74) *Attorney, Agent, or Firm* — Brinks Hofer Gilson & Lione

(57) ABSTRACT

A micro-reflectron for a time-of-flight mass spectrometer including a substrate and integrated with the volume of the substrate, means for application of a potential gradient in a volume suitable for constituting a flight zone of the ions. The means of application includes at least two polarization electrodes and a wall of at least one resistive material that can be polarized between these electrodes so as to generate a continuous potential gradient, itself providing the function of reflectron, this flight zone, these electrodes and this wall being obtained by the technology of microelectromechanical systems (MEMS) and this micro-reflectron having a thickness of less than 5 millimeters while its other dimensions are less than 10 times this thickness.

23 Claims, 11 Drawing Sheets

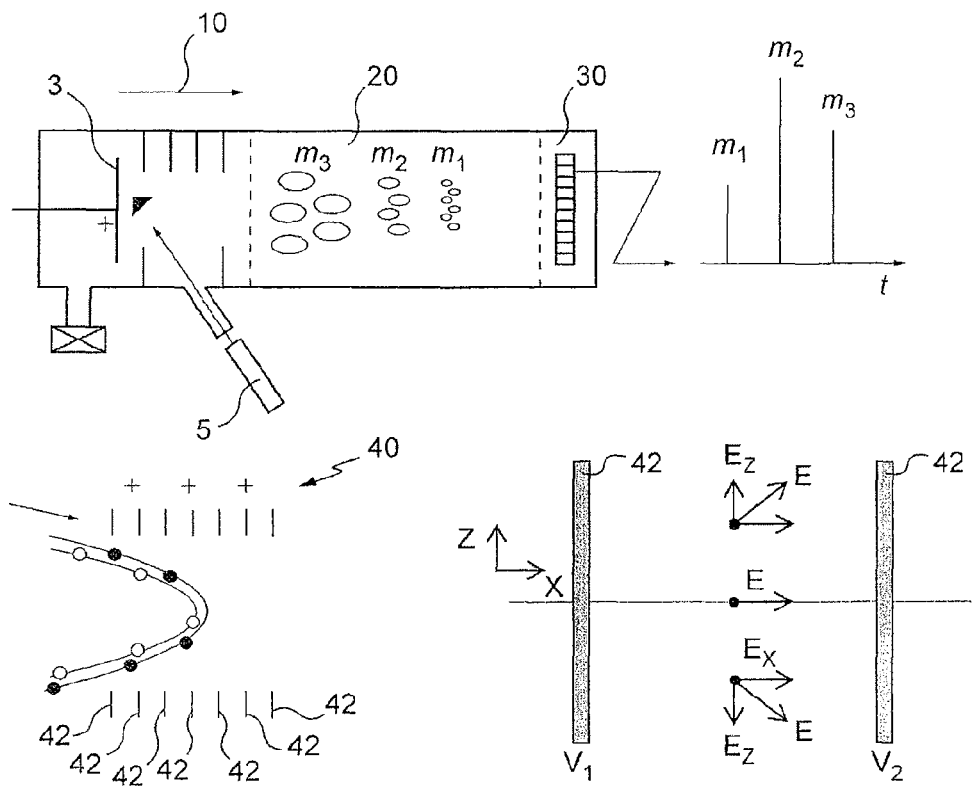
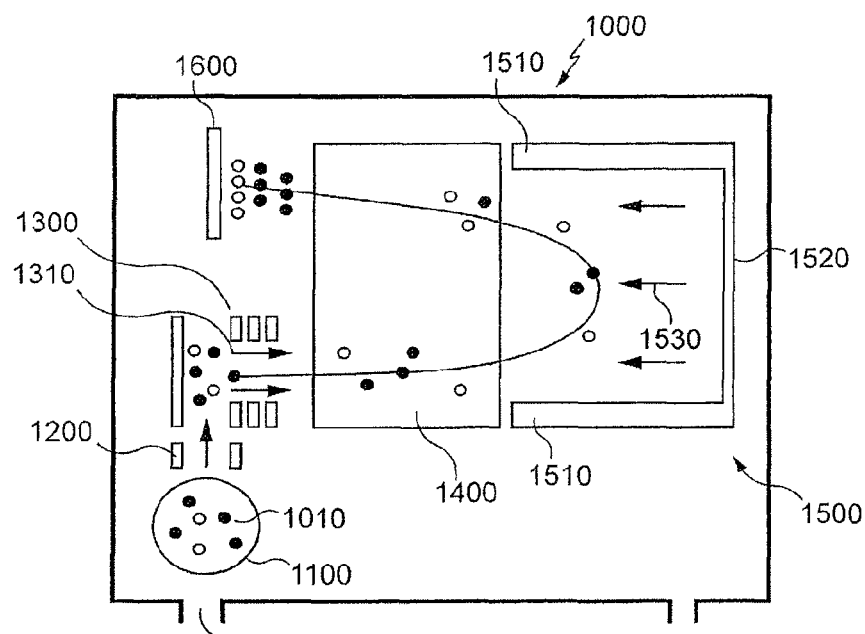

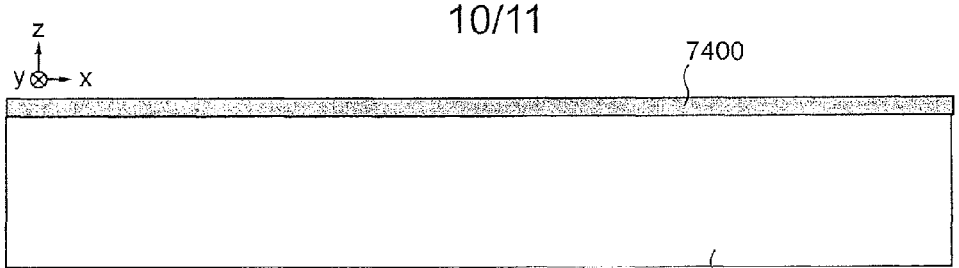
Fig. 26
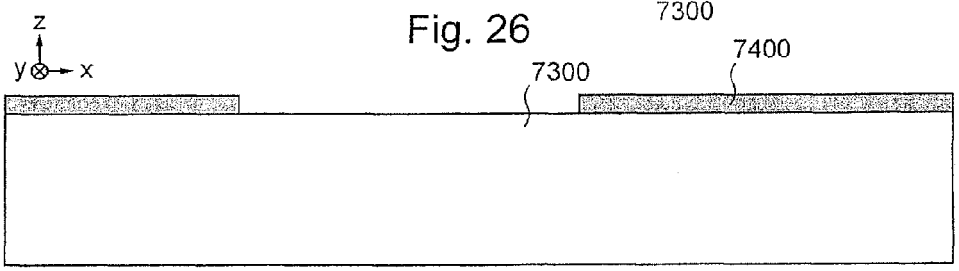
Fig. 27
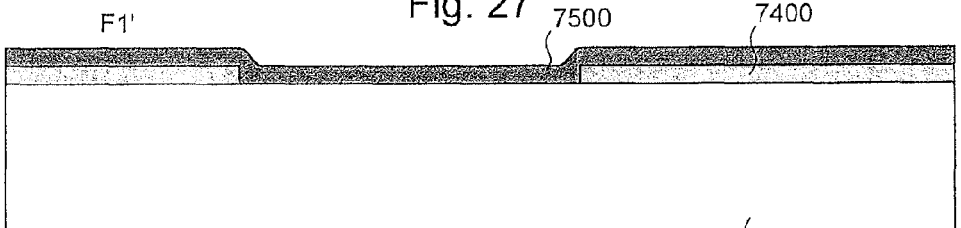
Fig. 28
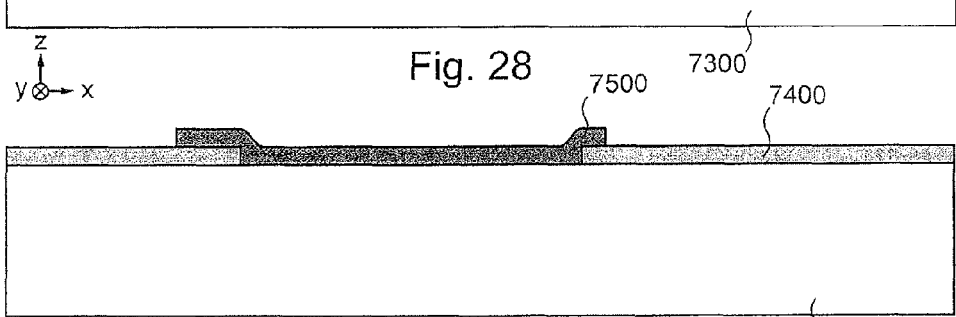
Fig. 29
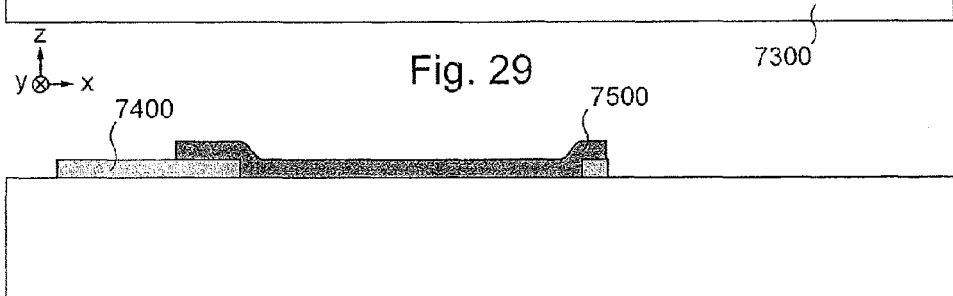
Fig. 30
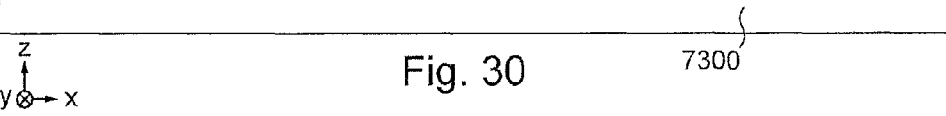

MICRO-REFLECTRON FOR TIME-OF-FLIGHT MASS SPECTROMETER

PRIORITY CLAIM

This application claims priority to French Patent Application No. 1150971, filed Feb. 7, 2011, the entire contents of which are incorporated by reference herein.

TECHNICAL FIELD

The invention relates to a micro-reflectron, produced by micro-fabrication, used in a time-of-flight mass spectrometer or in some other apparatus, as well as an assembly comprising said micro-reflection. It is applied firstly for chemical analysis in the broad sense, in particular applied to the needs of industry, to matters of security or to environmental monitoring.

BACKGROUND

In general, a great many techniques of chemical analysis are available for separating the species constituting a mixture as a function of various properties (size, mass, chemical properties, etc.). Among these technologies, mass spectrometry makes it possible to separate the species as a function of their mass. For this purpose, firstly the mixture to be analysed is subjected to ionization, which then makes it possible to separate the various compounds as a function of their mass-to-charge ratio. The ionized species are injected with a certain velocity into an electromagnetic field, which can be fixed or variable over time and in space. The forces that are exerted on the ions then modify their path as a function of their mass-to-charge ratio. This can lead to spatial or temporal separation of the different chemical species.

More particularly, the principle of a time-of-flight mass spectrometer, i.e. identifying chemical compounds as a function of measurement of a travel time specific to each species, has been known since the 1950s. The first device of this kind was described by W. Stephens in U.S. Pat. No. 2,847,576.

With reference to FIG. 1, which is a block diagram, the different ionic species m1, m2 and m3 are accelerated by an electrostatic field 10 and are then injected into a free flight zone 20 (or flight tube, which can have a length of 1 m in some devices), i.e. a field-free zone where the ions move apart ("drift zone") as a function of their mass-to-charge ratio. The lightest masses (m1) arrive at the detector 30 placed at the exit from this free flight zone 20 before the heaviest masses (m2, m3).

Measurement of the time of flight thus gives the value of the mass, as shown on the right of the figure.

Preliminary ionization, which takes place in a source 3, can be effected by desorption-ionization by means of a laser 5, but other ionization techniques exist.

Various techniques have been developed for greatly increasing the performance of this type of spectrometer. They involve for example modifying the architecture of the device, and adding elements for correcting the dispersions.

Thus, an electrostatic mirror 40, called a reflectron, is present in some mass spectrometers at one point or another in the flight zone. Said mirror 40, shown at the bottom of FIG. 1, employs a static electric field for changing the direction of the paths of the charged particles. It is conventionally composed of a series of discrete electrodes 42 isolated from one other and on which electrostatic potentials decreasing from one electrode to another are applied, thus creating a potential gradient along the path of the ions.

This mirror 40 is necessary for obtaining good resolution, in particular for devices of small dimensions in which the temporal and spatial dispersions cannot be ignored.

On the one hand, it can compensate for the spatial dispersion of the ions connected with the geometric extent of the ion source 3. Ions of identical mass can in fact be generated at different points of the source 3, which causes a random temporal dispersion, reducing the resolution of the system.

On the other hand, the mirror 40 enables ions having the same mass-to-charge ratio, but different kinetic energies, to arrive at the detector 30 at the same time. There is a position, downstream of the reflectron 40, where the time penalty imposed on the most energetic ions exactly compensates the advantage that the latter had initially over the less energetic ions. It is at this temporal focusing plane of the ions with identical m/z ratio that the detector 30 is positioned (not shown in this bottom part of FIG. 1).

More and more areas, in particular environmental monitoring, civil security and the chemical and petrochemical industries, have an increasing need to be able to perform measurements for analysis of the environment in situ, in real time and with stringent requirements in terms of performance. Mass spectrometers would be a useful measuring means for meeting this need for analysis, but existing devices are either bulky and expensive laboratory items, or portable instruments, rarely autonomous, with degraded performance.

Various problems are encountered on the route to miniaturization of mass spectrometers. On the one hand, it is necessary to develop techniques for manufacture of the special elements of the spectrometer that are reliable and are not too expensive. On the other hand, it is necessary to have a technique for acquisition of the signals collected at the exit of the device that is compatible with the miniature character of the distances, the travel times and optionally of the quantities of material injected into the instrument. Finally, it is necessary to develop solutions to problems encountered specifically at the micrometric scale, in particular related to distortion of the electromagnetic fields.

Regarding the methods of manufacture, teams are working on the miniaturization of mass spectrometers using MEMS technologies (MEMS: MicroElectroMechanical Systems). These techniques have led to the emergence of a new type of miniature components, such as sensors, actuators, or sources of energy.

Patents and scientific articles have been published in recent years on ion traps, quadrupolar filters or miniature magnetic filters, some of which have also been manufactured using MEMS technology. Significant patents in this field have the numbers U.S. Pat. No. 7,402,799, U.S. Pat. No. 6,967,326, U.S. Pat. No. 6,469,298 (corresponding to EP-1 218 921), U.S. Pat. No. 7,208,729 and U.S. Pat. No. 7,217,920. The article "Complex MEMS: a fully integrated TOF micro mass spectrometer" by Eric Wapelhorst et al., which appeared in Sensors and Actuators, A 138 (2007) pp 22-27, for its part describes a mass spectrometer in MEMS technology comprising a monochromatic temporal filter that only searches for a single ionic species. The complete spectrum of the chemical species present is obtained by applying a voltage ramp to the temporal filter. Multiple injections are therefore required, which takes a considerable time. The document "Fabrication of a novel micro time-of-flight mass spectrometer" by H J Yoon et al., which appeared in Sensors and Actuators, A 97-98, (2002), pp 41-447, finally describes a rudimentary time-of-flight mass spectrometer in MEMS technology, the very low resolution of which means that it can only distinguish ions of very small masses. In particular, it is noteworthy that this spectrometer does not comprise a reflectron, development of which at a small scale presents considerable difficulty.

The articles "A miniature MEMS and NEMS enabled Time-of-Flight Mass Spectrometer for Investigations in Planetary Science" by Roman et al., which appeared in Proceedings of SPIE, Vol. 6959, 1st Jan. 2008, pages 69590G1-G13 and "Simulation of a Miniature, Low-Power Time-of-Flight Mass Spectrometer for In Situ Analysis of Planetary Atmospheres" by King et al. (more or less the same authors as for the preceding article, but in a different order), which appeared in Proceedings of SPIE, Vol. 6959, 1st Jan. 2008, pages 69590E1 to E15, describe spectrometers which, although comprising elements of small size of the MEMS type, involve complex assembly of various components resulting in an assembly whose dimensions are not in the micrometric range, since the prototype that is described has dimensions of 5 cm in height, 10 cm in width, and 30 cm in length; this considerable length is due in particular to the time-of-flight chamber.

Moreover, regarding the electronic systems for signal acquisition, the advances made in recent years have resulted in the marketing of portable instruments permitting sampling of signals at several tens of billions of samples per second for a pass-band of several tens of GHz.

In the context of a mass spectrometer of the time-of-flight type, for which miniaturization results in envisaging differences in time-of-flight between particles of similar masses of less than a nanosecond, these new generations of sampling systems make reliable measurement of the signals possible, if effective separation has been carried out.

Finally, although there have been advances in the techniques for the manufacture of the specific spectrometer components and in the digital acquisition devices, the systems that have been offered still have a small analysis range as well as a limited resolution m/Δm (m being the mass of the ion for which the resolution is expressed, Δm the minimum mass difference measurable in the region of mass m), of the order of 10 to 50 for ions having a mass of only about a hundred atomic mass units.

Thus, the analysis is limited to chemical compounds of low mass and the resolution and sensitivity are low. Moreover, the devices are not very robust.

U.S. Pat. No. 7,605,377 describes a reflectron with discrete electrodes which is miniature, and can be used in a time-of-flight mass spectrometer. It comprises a substrate, on the surface of which the electrodes are present, individually secured by connecters formed in the substrate or coupled to the latter.

Nonetheless, in this device, the decrease in ratio between the dimensions of the discrete electrodes, including their distance apart, and the diameter of the ion beam, means that the distortion of the electric field in the lateral zones of the reflectron affects the ion beam.

In fact, as is shown schematically at bottom right in FIG. 1, the electric field is not uniform in the space between two electrodes. This defect of uniformity is maintained when the linear dimensions of the reflectron are changed (i.e. assuming the potential differences between the electrodes are altered in such a way as to maintain a constant potential gradient).

As the diameter of the ion beam is not changed, the result is that the defect of uniformity of the field, which was without consequence in a macroscopic device, becomes a major drawback in a microscopic device. The electric field component in the Z direction attracts the ions in the Z direction, therefore causing the ion beam to diverge. The ions that have diverged too much from their path strike the electrodes of the reflectron and are consequently lost for the analysis.

This problem greatly complicates the design of a time-of-flight mass spectrometer of small size, which is to have satisfactory resolution and sensitivity, incorporating a reflectron of this type with discrete electrodes.

A reflectron lens is known for conventional spectrometers of large size used in the laboratory and is described in U.S. Pat. No. 7,154,086 and US-2010/0090098. This device consists of a glass tube or a tube made of some other material on which a layer of glass is deposited, held by a single end at the bottom of a flight tube of the spectrometer. Such a device using a lens that is held at a single end is not compatible with the use of a substrate, on the surface of which the electrodes are present, individually secured by connecters formed in the substrate or coupled thereto, for example by stacking.

Such a device using a lens is also incompatible with a support having a function of mechanical support for manipulation of the device by a user in the volume of which the reflectron is integrated, for example by stacking. Moreover, the manufacturing techniques, the geometries and the materials used are not compatible with the methods of microfabrication of the microelectronics industry. It is therefore necessary to develop another fabrication technology for this element, which is indispensable for the development of a micro-mass spectrometer.

SUMMARY

The invention described below solves these problems and is able to provide a micro-reflectron which can be used in a portable micro-mass spectrometer, autonomous and with good performance, at reasonable cost.

Thus, the invention proposes a micro-reflectron, produced by the techniques of micro-fabrication, and which can be used in a time-of-flight mass spectrometer, which can be of small size.

More precisely, the invention proposes a micro-reflectron for a time-of-flight mass spectrometer, comprising a substrate and, integrated in the volume of the substrate (for example by stacking), means for applying a potential gradient in a volume suitable for constituting a flight zone of the ions, characterized in that said application means comprise at least two polarization electrodes and a wall made of at least one resistive material that can be polarized between said electrodes so as to generate a continuous potential gradient, itself providing the function of a reflectron; this micro-reflectron, in particular the flight zone, these electrodes and this wall are obtained by microelectromechanical systems (MEMS) technology and this micro-reflectron has a thickness of less than 5 millimetres while its other dimensions are less than 10 times this thickness.

The term "micro-", applying to the reflectron, indicates that at least one of its dimensions, for example the thickness measured from the outside of the substrate to the outside of the device opposite the substrate, is less than about 1 mm, or in any case about 5 mm. The other two dimensions, within which the path of the ions is contained, can each be greater than the thickness by a factor of 10 (or less). According to an alternative definition, the term "micro" indicates that the reflectron is manufactured according to the technologies of microelectronics.

It will be recalled that the technology of microelectromechanical systems unites methods of microelectronics (in the broad sense of the term including mechanical aspects) including various forms of etching, deposition, lithography and assembly/stacking which are well known by and within the capacity of a person skilled in the art. Thus, the fact that the structure of the micro-reflectron is obtained by said technology significantly means this structure in which it is easily recognized that this technology was used. It will be understood that the fact that said micro-reflectron is made on a substrate by such a technique in particular offers the advantage of allowing other elements of a spectrometer to be produced by the same technology on this same substrate.

Thus, the discrete electrodes known in the conventional reflectrons (it follows from the foregoing that none of them is truly a "micro-reflectron") are replaced by a resistive wall in which a continuous potential gradient develops, which provides a homogeneous field in the flight zone of the ions serving as reflectron despite the small size of the latter.

According to an advantageous feature, said wall comprises at least one layer of resistive material deposited on a surface of a volume of substrate material. This feature makes it possible to avoid excessive electrical consumption in the wall, as the layer can be very thin.

According to one variant, the layer of resistive material is isolated from said volume of substrate material on a portion of its surface by an insulating material. According to another variant, the volume of substrate material comprises or essentially consists of an insulating material, for example glass.

According to an advantageous feature, said wall comprises at least one surface portion of at least one volume of substrate material, which is of resistive material. This alternative solution offers the advantage of simplicity, since a single component can simultaneously provide the functions of support and of resistive wall.

According to another advantageous feature, the electrodes, for example metallic, which polarize said wall of at least one resistive material, are in direct contact with said wall. This feature provides precise control of the potential applied to the resistive wall.

According to an advantageous feature, the at least two electrodes in direct contact with said wall are themselves polarized at a distance by a volume of conductive material forming part of the substrate. This solution makes it possible, while giving good control of polarity, to provide a closed tube, which can be manufactured easily.

According to an alternative (or combined) advantageous feature, the at least two electrodes in direct contact with said wall have ends that are accessible from outside the reflectron, the latter being provided with a cover, which can be a substrate optionally having a support function, and the electrodes are polarized by these ends that are accessible from outside. This alternative solution offers the advantage of excellent control of the polarity applied.

According to various embodiments, said wall is a layer or a surface portion of a mass of titanium nitride, amorphous silicon, polysilicon, germanium, or metal oxide, and the material can optionally be doped.

The invention also relates to a time-of-flight mass spectrometer incorporating the micro-reflectron. A part or parts of the mass spectrometer other than the reflectron (in particular the injection zone, but also the ionization chamber, the ion extraction and focusing device and/or the detector) can also have a micrometric dimension or dimensions, and their fabrication can be simultaneous with that of the micro-reflectron, in the context of collective fabrication.

More precisely, the invention also relates to a time-of-flight mass spectrometer having a micro-reflectron of the aforementioned type additionally having an ionization source generating ions and a device for injection and acceleration of the ions towards the micro-reflectron, this injection device being obtained by the microelectromechanical systems (MEMS) technology on the same substrate as the micro-reflectron.

This choice makes it possible to ensure continuity of the ion beam between the source and the analyser: the various modules of the spectrometer are designed to be aligned.

Advantageously, the architecture of the spectrometer, with respect to the position of the injection and acceleration device, is selected in such a way that the ions are injected into the analyser orthogonally to their path at the exit from the ionization source of the ions. The sensitivity and resolution are thus increased relative to direct injection.

According to an advantageous feature, the injection device has a resistive wall, which is polarized by at least two metallic electrodes separated from said wall by a volume of a conductive material. This solution is easy to implement.

According to a design choice, the reflectron is placed just beyond the injection module, which makes it possible to reduce the losses of ions and therefore increase the sensitivity of the device. It should be noted that the device can comprise several free flight zones and several reflectrons, as well as several supplementary devices for increasing the resolution (energy filters and others), positioned freely as required.

Advantageously, the spectrometer further comprises a detector at the exit of the micro-reflectron, and the ionization source and this detector are produced there by the technology of microelectromechanical systems on one and the same substrate.

Also advantageously, this ionization source can, as a variant or in combination with the preceding paragraph, be produced by the technology of microelectromechanical systems (MEMS) on the same substrate as that of the micro-reflectron.

It goes without saying that when several elements are produced by the MEMS technology, it is recommended that identical steps of this technology are employed jointly for the various elements.

This monolithic fabrication guarantees excellent positioning of the various elements relative to one other, while contributing to the miniaturization of the assembly, as there is no need to provide connecting elements.

Also preferably, the ionization source is manufactured by volume machining in the technology of microelectromechanical systems, and has an electron attracting grid and an electrode assembly constituting an ionization chamber, for attracting or repelling ions that are formed, this ionization source being formed on the same substrate as the micro-reflectron.

The invention also relates to a fabrication method for a microspectrometer, in particular for its micro-reflectron, comprising a step of deep etching. It can be a wet etching step or a dry etching step, for example DRIE etching, of a substrate to form the cavity of the flight zone of the ions or of a stencil which then serves for a step of thick deposition for forming the walls of the flight zone of the ions.

In certain embodiments, the method comprises deposition of a layer of said resistive material or of materials constituting the electrodes.

According to one feature, the method comprises a step of sealing of two substrates so as to form said flight zone of the ions, the sealing being of the "direct bond" type, eutectic bonding, anodic bonding or gluing with resin.

Thus, the invention proposes a fabrication method for a micro-reflectron of the type mentioned above comprising a step of wet etching or of deep reactive ionic etching (DRIE) of a substrate to form said flight zone of the ions, a step of depositing a layer of said at least one resistive material, for example by epitaxy, or of a material constituting electrodes, and a step of sealing two parts of the substrate so as to form said flight zone of the ions, the sealing being of the "direct bonding" type, eutectic bonding, anodic bonding or gluing with resin.

The proposed time-of-flight mass spectrometer can be used in systems for analysis or chemical detection of pollutants or of toxic compounds for example, portable or transportable, in particular autonomous field devices.

This mass spectrometer can for example be used for continuous monitoring for the presence or absence of pollutants or toxic substances in public places (in particular public transport networks, stadiums, airports or industrial sites). This device can also be used as a system for rapid analysis in municipal bioanalysis laboratories (e.g. in systems for bacterial identification). It can also be used for monitoring manufacturing and distribution chains in the food industry.

BRIEF DESCRIPTION OF THE DRAWING

The invention will now be described in detail, referring to the attached drawings.

FIG. 1 shows a block diagram, known per se, of a time-of-flight mass spectrometer.

FIG. 2 shows a block diagram of a time-of-flight mass spectrometer equipped with a reflectron according to the invention.

FIGS. 22 to 33 show steps in the fabrication of a spectrometer according to a second general embodiment, FIG. 22 constituting a synopsis of the entire process.

DETAILED DESCRIPTION

Figure 3:
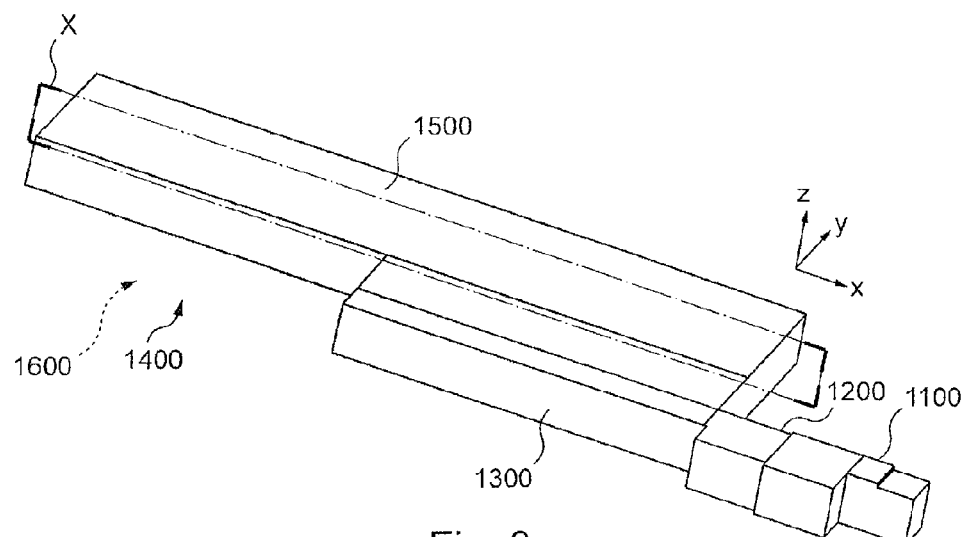
FIG. 3 shows a general view of a spectrometer according to the invention, shown without the detection system.

The general architecture of a mass spectrometer 1000 according to the invention is shown in FIG. 2.

Said spectrometer 1000 is of the time-of-flight type. In this device, the ions 1010 are created continuously in an ionization chamber 1100 called the source, operating for example on the principle of electronic ionization. A gas containing the sample is fed into the ionization chamber via a capillary 1005. The gas is then bombarded with electrons, which are generated by a filament.

Other methods of ionization can be used, in particular electrospray ionization (ESI) for biological applications.

The ions are extracted from the ionization chamber and their paths are focused in a beam a few hundreds of microns in diameter by an extraction and focusing device 1200. The latter uses an electrostatic potential applied to an electrode placed at the exit of the ionization chamber. In the example shown here, three rings, suitably polarized, forming an assembly called an Einzel lens, allow the ion beam to be focused (i.e. reduced in diameter) before the latter is injected into the flight zone of the spectrometer. The ions are also accelerated by an injection device 1300 with an electric field 1310.

The velocity of each ion depends on its mass-to-charge ratio. The path of the ions passes one or more times through one or more free flight zones 1400, without field (here, there is a single free flight zone, but it is traversed before and after passage through the reflectron 1500). In this zone, each ion has uniform motion at constant velocity, which depends on its mass. Over a sufficient length, all the ions are separated in time as a function of their masses.

Moreover, the ions are deflected by the reflectron 1500, in which there is an intense electrostatic field which is opposite in direction to their path. This region slows the ions and then causes them to change direction.

The reflectron 1500 comprises a single continuous wall, in this case with a bottom, polarized for example at its two ends 1510 (free edge on the left in FIG. 2) and 1520 (bottom on the right in FIG. 2). This wall is constituted by resistive materials and consequently there is no discontinuity of potential along the wall, and it varies continuously between the ends 1510 on the one hand and the bottom 1520, on the other hand. The potential gradient created along the path of the ions is compatible with the needs of a MEMS mass spectrometer.

The reflectron 1500 makes it possible to compensate for the imperfections connected with the source (in particular spatial and energy dispersions). All ions of the same mass leave the reflectron at the same time on the same line.

A detector 1600 counts the successive arrivals of each packet of ions of identical mass. The time taken by the ions, since their injection in 1300 (or since their extraction from the ionization chamber) to reach the detector 1600 located at a known distance in the focal plane at exit from the spectrometer, is measured. As mentioned in the introduction, this length of time is called the time of flight, and the mass-to-charge ratio is determined from the time of flight.

The ionization chamber 1100, the ion extraction and focusing device (1200) and the detector (1600) can be integrated, or not, in MEMS technology, on one and the same substrate or on substrates of which at least one is common to several of the devices of the spectrometer. The device can comprise several free flight zones, and/or several reflectrons. Optionally, additional devices for energy or mass filtering are also present. Moreover, it is advantageous for the injection (and acceleration) device 1300 to be fabricated in MEMS technology jointly with the reflectron, as this eliminates the tedious steps of beam alignment between the injection device and the reflectron (alignment is ensured by the design).

Remarkably, injection is orthogonal: the acceleration electric field 1310 is perpendicular to the direction of extraction of the ions by the extraction device 1200.

The detector 1600 is for example a microchannel amplifier associated with a single electrode. The whole is connected to an impedance adapting stage and then to a digital sampler (not shown).

The length of the various elements depends on the characteristics required for the spectrometer. The characteristic dimensions of this spectrometer can be close to (or less than) 1 cm on a side for a thickness of 1.5 mm (transversely to the plane of FIG. 2).

In the context of the invention, a dimension close to 1 cm denotes that it is of the order of a centimetre, or of a few centimetres (typically of the order of 2 to 3 centimetres).

In another embodiment (not shown), detection is effected by a network of nano-beams (MEMS or advantageously NEMS—"nano-electromechanical systems"). These movable mechanical structures are gravimetric detectors, caused to oscillate at their resonance frequency. Any addition of mass (of ion) to their surface is reflected in a frequency shift through inertia. The added mass is therefore evaluated by control electronics, enabling this frequency shift to be read.

According to other embodiments, the ions leaving the spectrometer are detected using different techniques, such as a channeltron, or a microchannel-plate amplifier.

The miniature device described is able to take advantage of the intrinsic performance of the architecture of time-of-flight mass spectrometers, namely a wide range of masses analysed, good sensitivity, in particular because of orthogonal injection, and acquisition of the mass spectrum at high frequency.

As the final device is of small size (of the order of a centimetre at most, see above), the mean free path of the ions is reduced considerably relative to that of a conventional mass spectrometer. One of the consequences of the invention is therefore that this microspectrometer can be used at much higher pressures (gain by a factor of 10 at least).

With reference to FIG. 3, which shows a perspective view of one embodiment of the spectrometer according to the invention (without detection element), the length of the various elements depends on the characteristics that are required for the spectrometer. The characteristic dimensions of this spectrometer, produced using MEMS technology, can be close to 1 to 3 cm on a side (from left to right, or from front to back in the figure) for a thickness of 1.5 mm (from top to bottom in the figure). The free flight zone 1400 is downstream of the reflectron 1500 in this embodiment, and is followed by a detector, which is not shown (corresponding to reference 1600 in FIG. 2), but which has to be positioned at the location indicated by the corresponding reference.

In certain embodiments, the mass spectrometer is coupled to a (liquid or gas) chromatography column and to different ionization chambers depending on the type of samples to be analysed (gas, liquid, biological sample).

The device is equipped with a system for signal conditioning and rapid digital acquisition (not shown, of any suitable known type). A large margin of progression is also possible on existing acquisition systems, which will make it possible in future to reduce the dimensions of the mass spectrometer accordingly.

The range of masses detected is very wide, a limiting factor being the temporal resolution of the digital sampler used for measurement (at the detector). The measurements can thus easily extend to ions from 1 to 10 000 amu (atomic mass unit). Resolution is high, and is for example well above 1000 for ions of 1000 amu.

Figure 4:
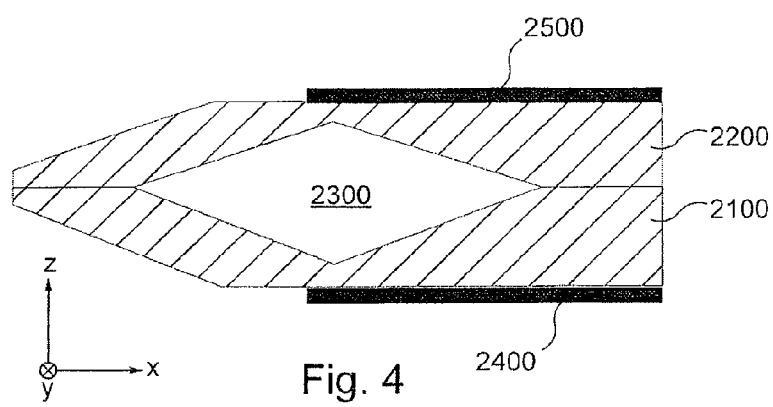
FIG. 4 shows a variant of a first general embodiment of a spectrometer according to the invention.

With reference to FIG. 4, which shows a section close to that of parts 1200 and 1100 (in a plane with constant "x"), for example through the injection device 1300 preceding the reflectron 1500 perpendicularly to the plane referenced X in FIG. 3, the mass spectrometer is produced, as mentioned above, using MEMS technology. A first fabrication method is based on deep anisotropic chemical etching of two wafers (also called substrates or slices) of silicon 2100 and 2200 with potassium hydroxide (KOH).

This etching makes it possible to form the cavity 2300, in which the electric fields required for operation of the spectrometer are applied after assembly and polarization. This cavity 2300 is also called the tube. The path of the ions is confined in the tube. The two wafers 2100 and 2200 are assembled by welding. The dimension shown from top to bottom is the thickness.

A succession (transversely to the plane of FIG. 4) of fine metallic tracks 2400 and 2500 parallel to one another is deposited on each of the outer faces in order to apply the desired electric potentials along the path of the ions for their acceleration. The wafers 2100 and 2200 considered in this embodiment are of silicon with sufficient doping to ensure good polarization of the cavity 2300. The surface of the silicon in cavity 2300 is bare, and it is the surface portion of the silicon of wafers 2100 and 2200 that constitutes a wall of resistive material, which creates the electric field in cavity 2300. The surface portion of wafer 2100 is integrated with the volume of the support constituted by wafer 2100. In the same way, the surface portion of wafer 2200 is integrated with the volume of the support constituted by wafer 2200. The electrodes 2400 and 2500 are set at the same potential in the plane of FIG. 4. As noted above, in a plane parallel to that of FIG. 4, but shifted relative to the latter, two other electrodes 2400 and 2500 are set at a second potential, which creates a potential gradient in the wall of resistive material, perpendicularly to the plane of FIG. 4.

In the context of a variant of the embodiment in FIG. 4, an example of a method is described with respect to the reflectron in FIGS. 5 to 17, which, like FIG. 4, are sectional views of the tube in which the ions circulate; more precisely, they are sectional views of the zone that is intended to serve as reflectron, following or parallel to the plane that is shown with reference X in FIG. 3.

Figure 5:
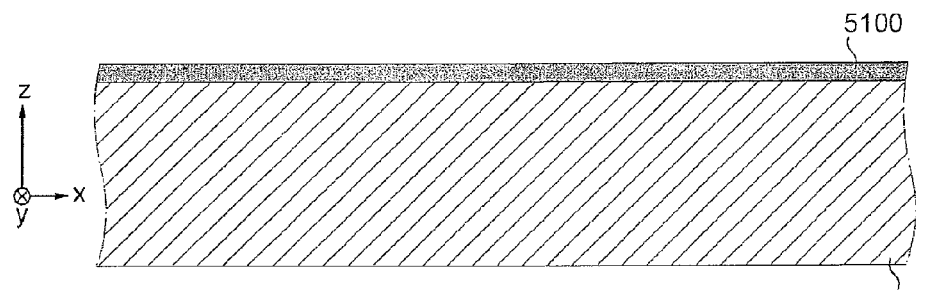
FIGS. 5 to 17 show steps in the fabrication of a second variant of a spectrometer according to the first general embodiment.

FIG. 5 represents a dielectric layer 5100 of silica and/or silicon nitride, deposited continuously on wafer 3100. In an embodiment that is not shown, a silicon oxide/nitride bi-layer is used.

Figure 6:
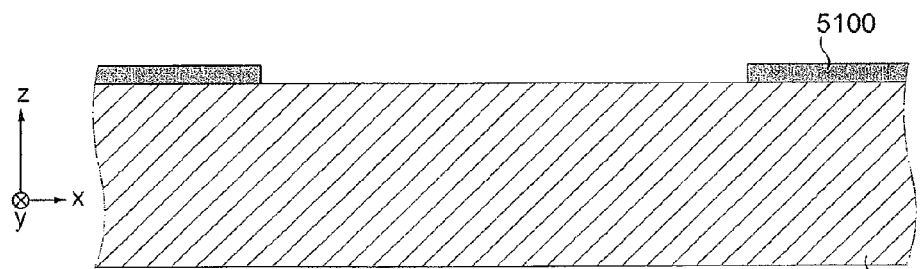

FIG. 6 shows this layer 5100 after it was structured by lithography and etching. The etching can be reactive ion etching (RIE) for example. Certain zones of layer 5100 have been removed completely, making it possible to use layer 5100 to form a mask, defining a horizontal etching pattern. This is followed by an etching step E1, here in a bath of potassium hydroxide (KOH).

Figure 7:
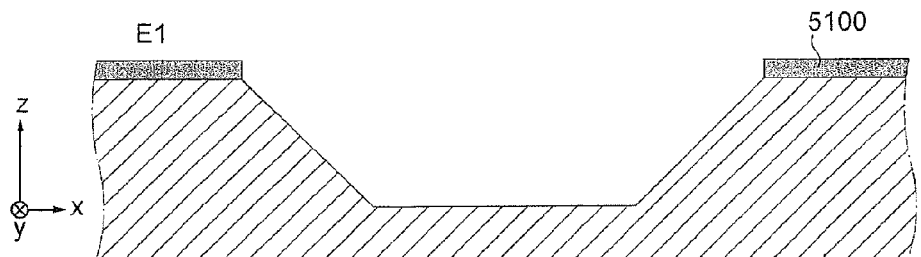

FIG. 7 shows the result of KOH etching of the silicon. The zones of layer 5100 that were retained protected the silicon zones during etching (the material constituting this layer was selected accordingly).

One half of the future tube of the spectrometer (here at the level of the reflectron) thus assumes a flat-bottomed V shape. The slope and the depth of etching are fixed by the crystalline orientation of the silicon and by the etching time. Depending on the intensity of etching (which is, however, always of the deep etching type), the flat bottom can be reduced to a very small length, or even may not be present, as shown in FIG. 4 with reference to the injection zone.

As a function of the horizontal etching pattern defined in the preceding step, all of the elements of the spectrometer were formed, fabricated using MEMS technology, in particular the zone of the reflectron 1500, the injection zone 1300, and optionally the zones for ionization and focusing 1100 and 1200, the etching zones in a substrate advantageously common to these various elements having been able to change direction, transversely to the thickness, from one zone to another. The oxide or nitride mask 5100 is removed at this stage.

Figure 8:
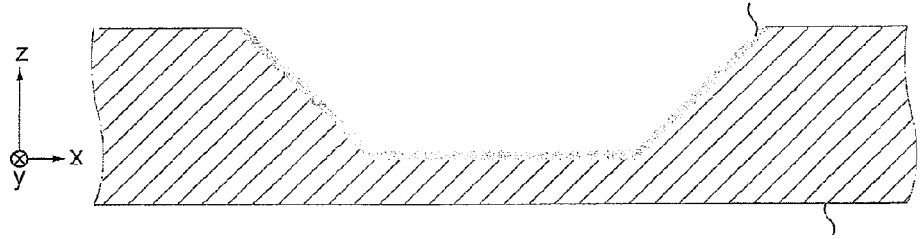
Figure 9:
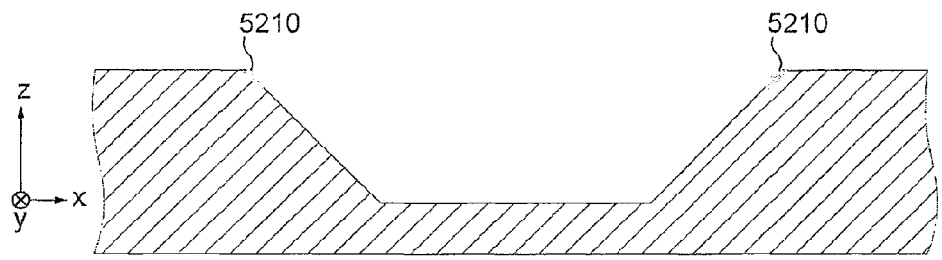

FIGS. 8 and 9 show the deposition of electrodes 5200 and 5210 in the etched channel, at the level of the reflectron. This deposition is not carried out in the whole tube of the spectrometer, and is only applied in the context of one example of implementation. In particular it is not used in the context of the embodiment in FIG. 4 with respect to the injection zone. The deposition can be effected through a stencil, for example. In one embodiment, a lift-off technique is used, in particular on a gentle slope. The electrodes 5200 and 5210 can consist of a layer of gold, of gold with Cr/Au or more generally of one or more layers of a conductive material.

FIG. 8 shows the form of an electrode 5200. The whole surface of the V, including the two inclined surfaces of the edges and the flat surface of the bottom, is covered with the metal of the electrode. This can in particular be the case at the end of the reflectron.

For its part, FIG. 9 shows the form, in one embodiment, of an electrode 5210 in the zone which will later be used as the reflectron. In this last zone, the silicon 3100 is left bare on most of the V.

Figure 10:
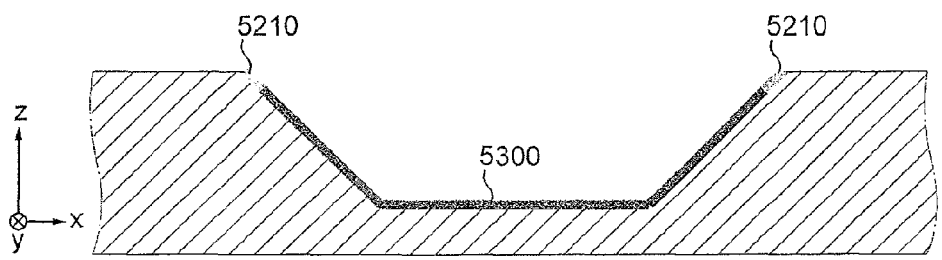

Then a layer of insulating material 5300 is deposited on the surface of the silicon left bare. This deposition is carried out for example by PECVD ("plasma enhanced chemical vapour deposition"), and is then structured by lithography. FIG. 10 shows the insulating layer 5300 thus deposited on the silicon walls of the V in the zone intended to serve as reflectron (the plane of the section is the same as in FIG. 9), between the electrodes 5210.

Then a resistive layer 5400 is deposited in the zone that will later be used as the reflectron, on the layer of insulating material 5300 and on the electrodes 5210. Deposition (step E2) can be carried out by epitaxy. Various methods of deposition can be used for step E2, in particular: CVD ("chemical vapour deposition"), PECVD, PVD ("physical vapour deposition"), spraying, vacuum evaporation, electrolytic deposition. A stencil or lithography/etching steps are also used. This layer 5400 can in particular consist of amorphous silicon, titanium nitride or metal oxide and can have a thickness between 10 nm and some 100 nm.

Figure 11:
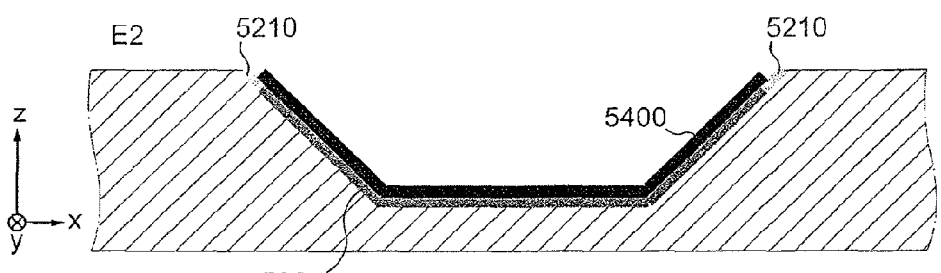

FIG. 11 shows the final form of the resistive layer 5400 deposited in the zone of the reflectron. This layer 5400 forms a wall integrated with the volume composed of the stack 3100-5300-5400-5210.

It should be noted at this stage that the step of deposition of the electrode 5210, represented with reference to the reflectron zone, is optional in other zones of the tube, even when undertaking deposition of a resistive layer 5400, since it depends on whether or not it is decided to insulate the largest surface of the resistive layer 5400 of the silicon, which it will be recalled is conductive.

Advantageously, layer 5300 makes it possible to insulate the resistive film 5400 of the conductive silicon 3100 on the largest surface of film 5400, but its ends are in contact with the electrode 5210 if it is present, or the substrate 3100. Thus, there is no short-circuit of the resistive film 5400.

Figure 12:
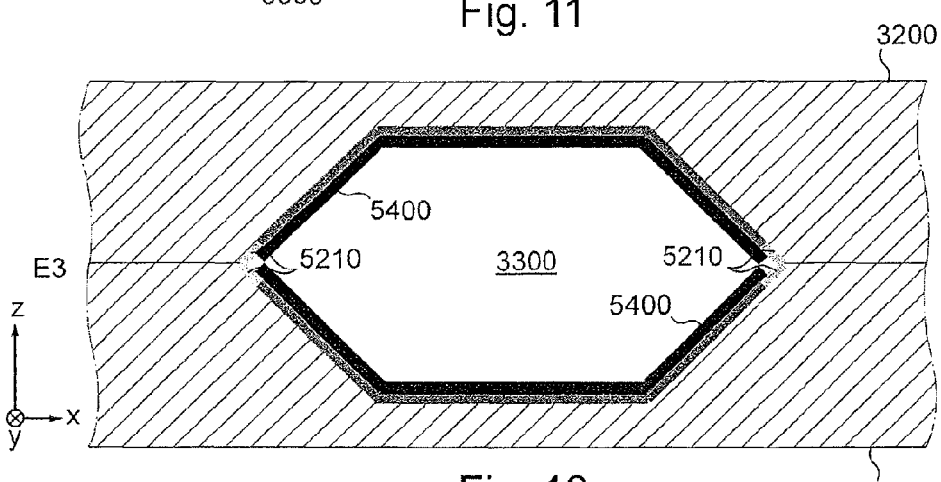

Face-to-face assembly of two structures similar to that just prepared in FIG. 11 (step E3) is then carried out. FIG. 12 gives an example of sealing by silicon-on-silicon direct bonding of these two structures, where the silicon wafers have the references 3100 and 3200. Eutectic bonding (gold/tin Au/Sn for example) is also used in an alternative embodiment. This sealing makes it possible to produce the tube 3300 of the spectrometer, shown here in its reflectron zone. The dimension shown from top to bottom is the thickness.

Figure 13:
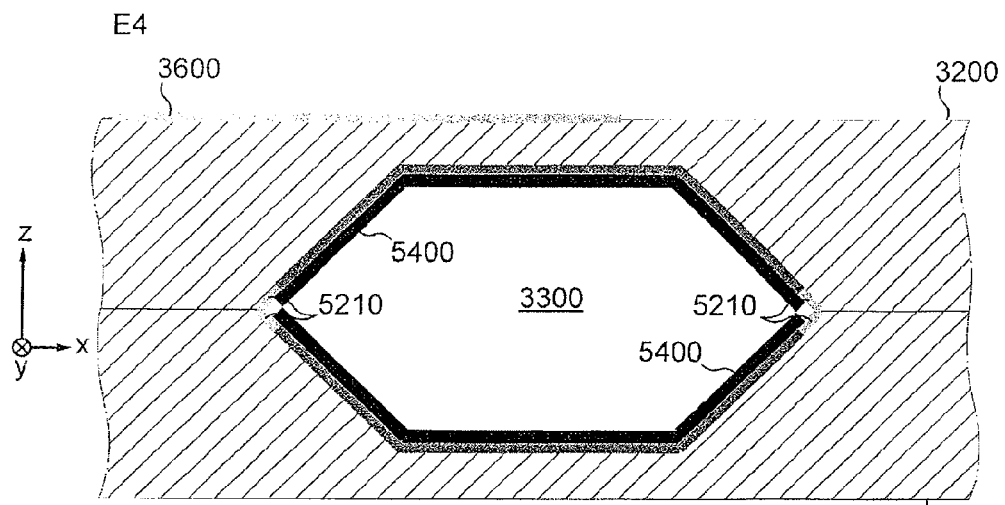

FIG. 13 shows the deposition of an electrode 3600 enabling the zone of interest to be polarized (a similar electrode has already been mentioned with reference to FIG. 4). This electrode 3600 is a metallic layer (gold or aluminum-silicon alloy for example). In one embodiment, it is deposited by PVD (physical vapour deposition) and then etched through a resin mask. This step is designated step E4.

Two other etching steps are then performed on the stack to extract the device from the assembly constituted by the outer portion of the silicon wafers.

Figure 14:
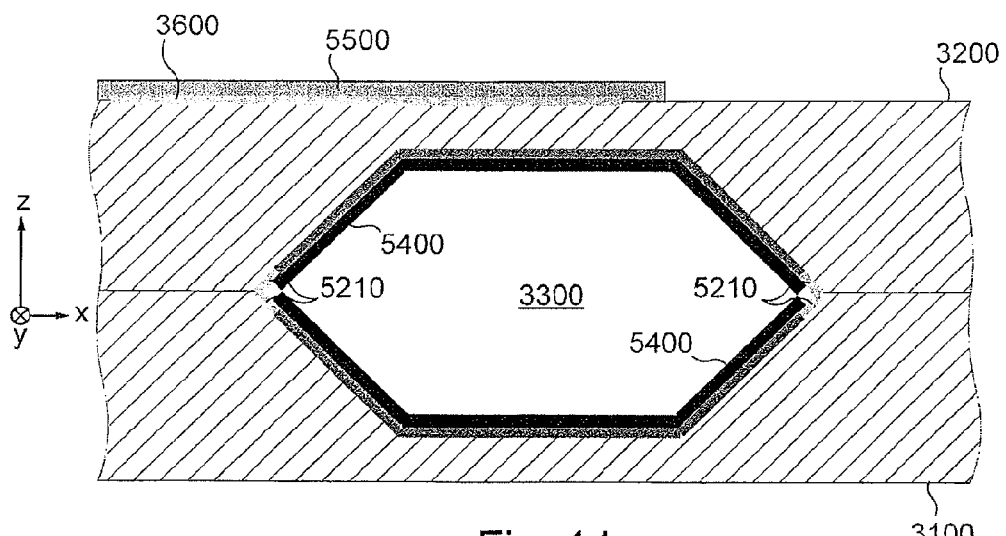
Figure 15:
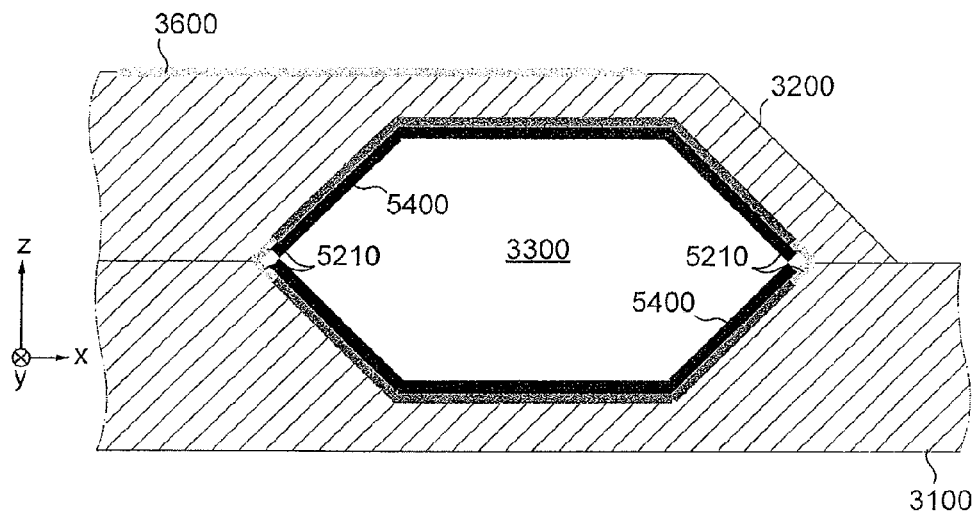

FIG. 14 shows the deposition of a physical mask 5500 (an oxide or a nitride for example) on the surface of the silicon wafer 3200, for protecting the zones that are not to be etched, including the electrode 3600. Etching is then carried out on the exterior of wafer 3200. The etching is KOH etching in this case. It is also possible to use DRIE etching. FIG. 15 presents the result of this step, after removing the mask 5500.

Figure 16:
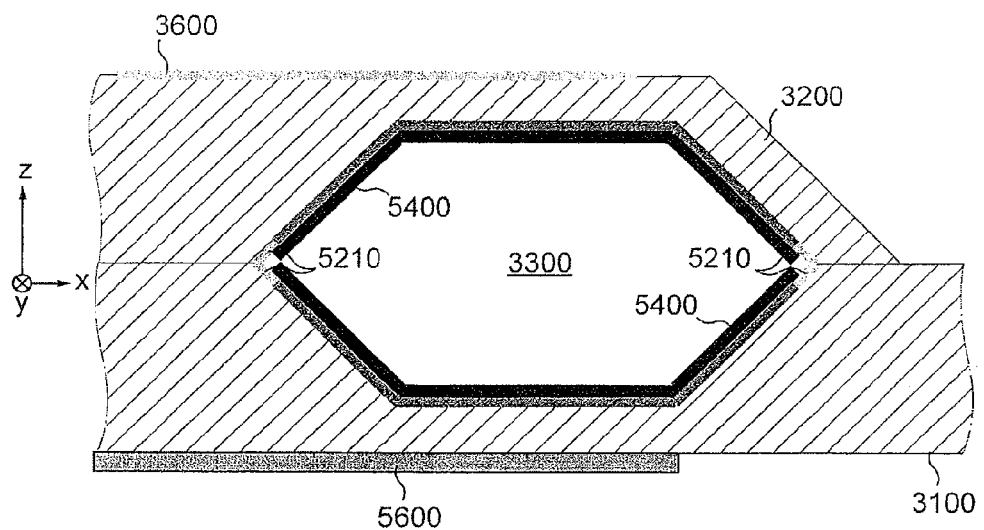
Figure 17:
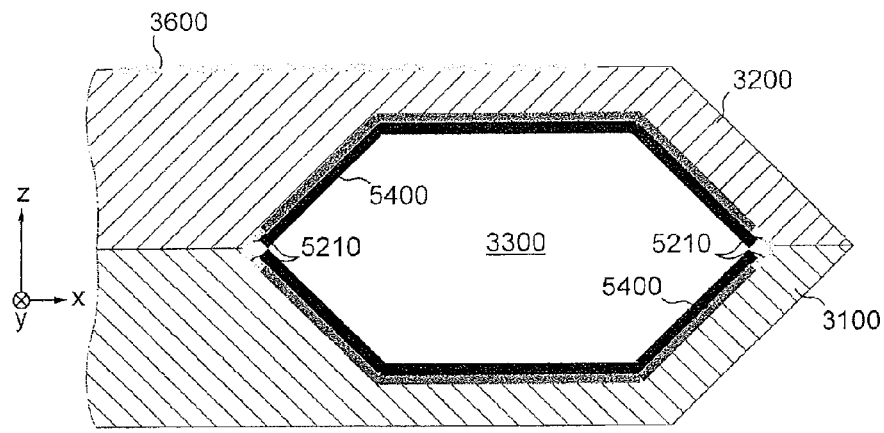

FIG. 16 shows a physical mask 5600 on the outer surface of the silicon wafer 3100, protecting the zones of wafer 3100 that are not to be etched. FIG. 17 shows the final tube when a second KOH etching has been performed on the front (lower) face of the stack. Once again, the etching can be DRIE etching as a variant.

Moreover, an electrode similar to electrode 3600 can be deposited on the surface of wafer 3100 in order to obtain, after assembly and polarization, layers present on both sides of the structure, thus ensuring better uniformity of the electric fields in tube 3300 (as in the embodiment shown in FIG. 4).

It will be understood that, since layers 5400 are of resistive material, application of a potential difference between the metallic electrodes 5210 causes a continuous variation of potential within said layers 5400 on going from one of these electrodes to the other (for example an increase from left to right, such as between zones 1510 and 1520 in FIG. 2), hence the desired reflectron effect.

Figure 18:
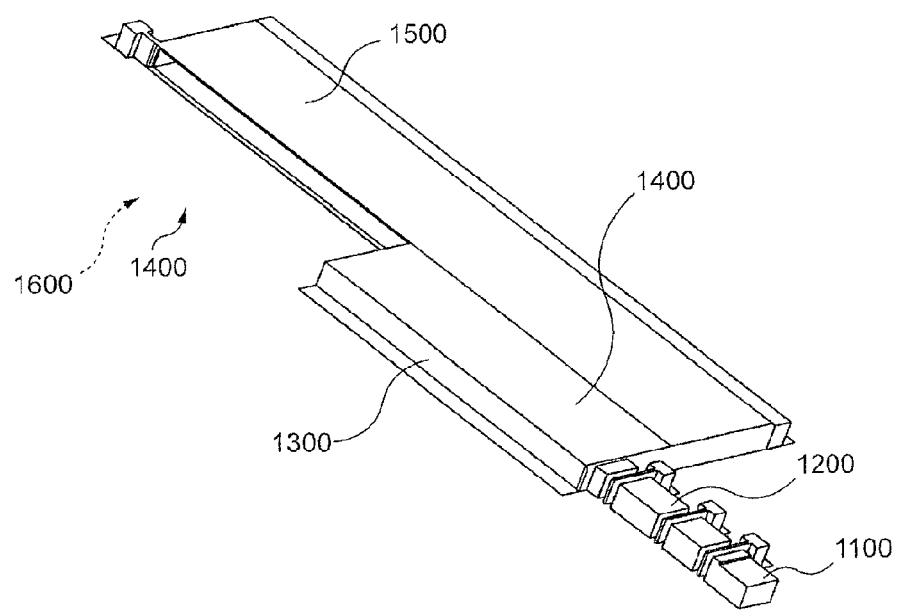
FIGS. 18 to 21 show a second general embodiment of a spectrometer according to the invention.
Figure 19:
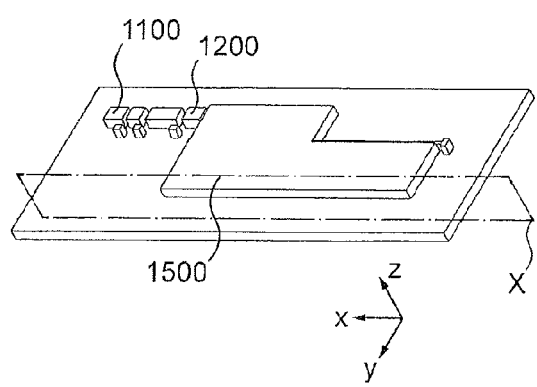

According to a second general embodiment, the technique of deep reactive ion etching (DRIE) is used for fabrication of the device. Once again it is anisotropic etching. FIG. 18 shows the device resulting from the method according to this second method of fabrication. This figure uses the same reference numbers as in FIG. 3. As in FIG. 3, the free flight zone 1400 is positioned downstream of the reflectron 1500, and the detector 1600 is not shown, but must be positioned at the location indicated by the corresponding reference. FIG. 19 shows another view of the final device, which shows a section plane x-x, transversely to which the various steps of the fabrication method will be described below with respect to the reflectron.

Figure 22:
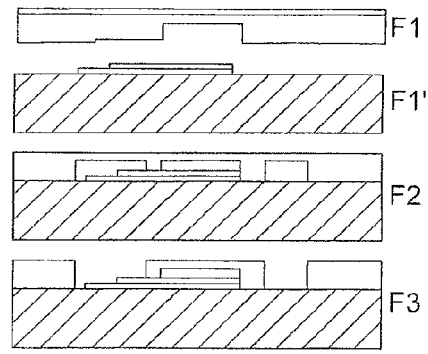

FIG. 22 shows the main steps of the fabrication method. A first phase F1 comprises a step of etching a silicon substrate, which makes it possible to produce the channel in which the ions will travel. A parallel phase F1' comprises a step in which a resistive film, which will constitute a portion of the reflectron, is deposited on a glass substrate.

The two substrates are then welded together in a phase F2, for constituting the tube of the spectrometer, and more particularly the tube of the reflectron.

An etching phase F3 is then carried out in order to define the contours of the mass spectrometer and to form the focusing stage 1200 (not shown). At the end of this step, the microspectrometer is ready, isolated on its glass support.

Figure 20:
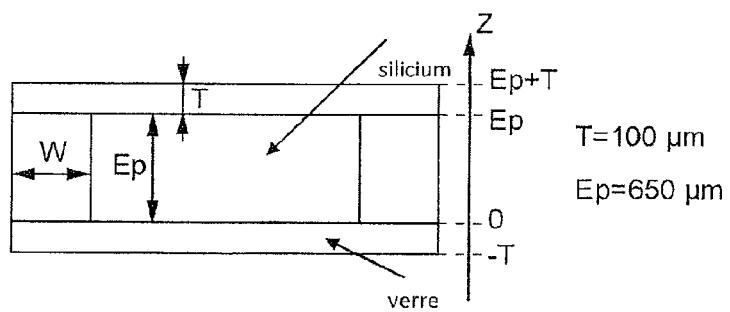
Figure 21:
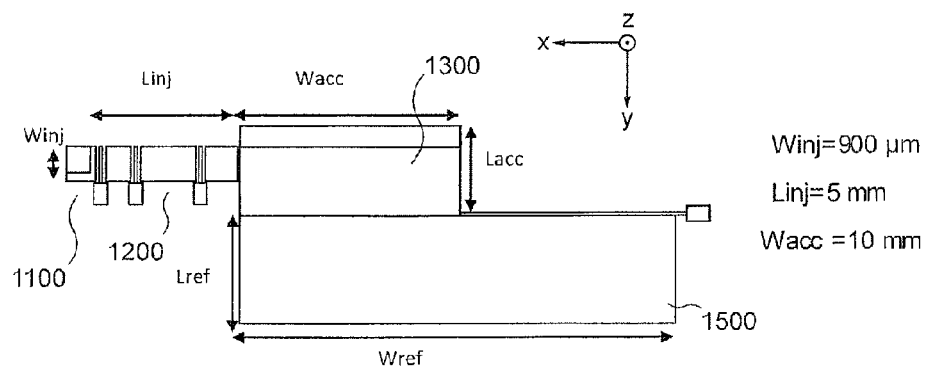

Without being limiting, the dimensions of the final device in its thickness (in direction z) and typical dimensions in the (x, y) plane are shown in FIGS. 20 and 21 (thicknesses of glass of some hundreds of micrometres, for example 100 micrometres, separated by a tube with a thickness of 650 micrometres; an injection length of 5 mm on a thickness of 900 micrometres, a length of the acceleration zone of 10 mm, hence, taking the proportions into account, a reflectron length of the order of 20 mm for an overall width of the order of 15-20 mm); the dimensions of the spectrometer in width and in length are typically less than 3 cm in total, for a thickness of less than 5, or 3 mm or even 2 mm. As a guide to the order of magnitude, the dimensions of an example of microspectrometer according to the invention are roughly the diameter of a two euro coin (2.5 cm), to within 20%.

Figure 23:
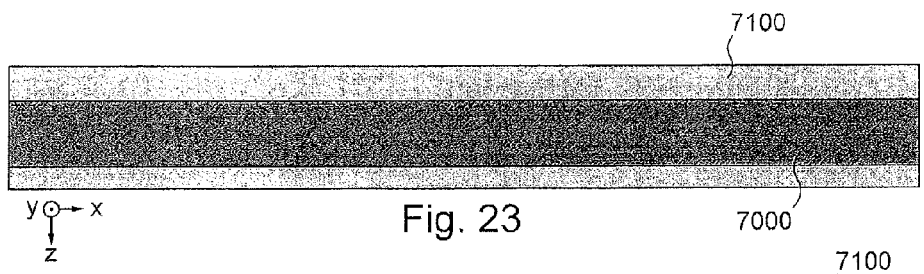

With reference to FIG. 23, firstly a silicon wafer 7000 is selected, polished on both faces, on which a layer of silica ($SiO_2$) 7100 is deposited (for example by PECVD—plasma-enhanced chemical vapour deposition—or alternatively by thermal oxidation) on a thickness from 5 to 10 μm for example as shown in FIG. 23. This layer of oxide 7100 is used later as a physical mask protecting the zones that must not be etched.

Figure 24:
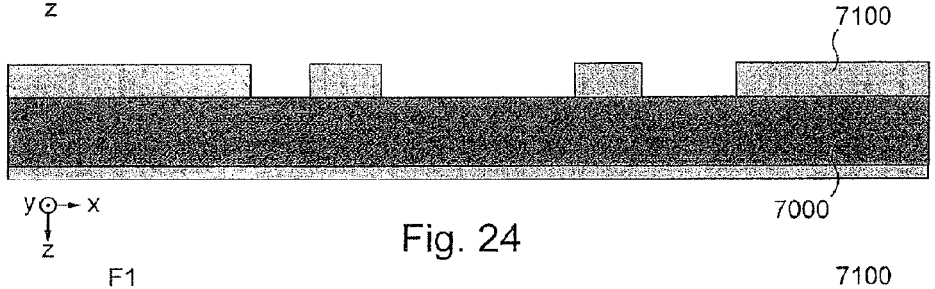

The result of dry etching (for example RIE) of the layer of oxide 7100 is shown in FIG. 24. This makes it possible to remove the oxide on the zones of the wafer 7000 that are to be etched in the DRIE step.

Figure 25:
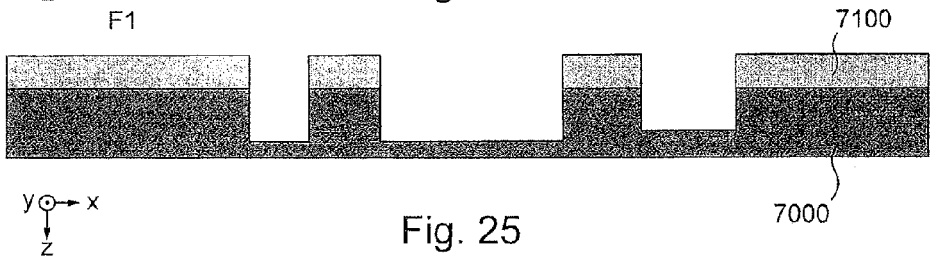

FIG. 25 shows the step of deep etching F1 which serves for carving out the silicon of wafer 7000 to permit passage of the ions of the future spectrometer. Etching is deep, on a thickness of several hundreds of microns.

The layer of oxide 7100 is then removed, using hydrofluoric acid (HF) for example (not shown).

The surface portion of the volume of silicon 7000 constitutes a wall of resistive material integrated in the volume of the substrate constituted by the silicon 7000. If a sufficient thickness is preserved for this throughout the fabrication method, this volume has a function of mechanical support. However, as shown in the next figures, the function of mechanical support can be entrusted to a glass support.

With reference to FIG. 26, a glass plate 7300 is then used, polished on both faces, on which an electrode 7400 is deposited. The latter consists of a layer of metal (for example aluminum-silicon alloy AlSi, tungsten W, aluminum Al or titanium Ti) with a thickness of some hundreds of nanometres, for example 500 nm, which is deposited by spraying (physical vapour deposition, PVD). An evaporation technique can also be used.

The glass plate 7300 has a role of protective cover in the final device and also supports the polarization electrodes 7400.

Steps of etching of the metal 7400 are then carried out, and the result is shown in FIG. 27. Etching is performed advantageously by a wet method (with an etching bath appropriate to the metal selected) but can be performed by plasma. This step allows the metal to be removed in the zone of the reflectron between two successive electrodes so that the surface of the resistive film deposited later is insulated from the metal.

A very thin resistive film 7500 is then deposited as shown in FIG. 28 (step F1'). It can consist of a semiconductor material, for example amorphous silicon, polysilicon or germanium or some other material. The deposition technique can be epitaxy. The thickness depends on the resistivity of the material selected and can be between some nanometres and some hundreds of nanometres, for example between 5 and 500 nm. The resistivity of the film 7500 can also be modulated by doping the material used, if necessary.

Steps of etching the resistive film 7500 are then carried out. The resistive film 7500 is removed everywhere outside the tube. The result is shown in FIG. 29. The etching is preferably dry plasma etching, but a wet method could be used.

A last series of steps of etching of the assembly of electrode 7400 and resistive film 7500 is carried out to define the form of the electrodes. The result is shown in FIG. 30. Importantly, electrode 7400 extends beyond the resistive film 7500 laterally.

In FIGS. 28, 29 and 30, the resistive film 7500 constitutes a wall integrated with the volume consisting of the stack 7300-7400-7500.

Figure 31:
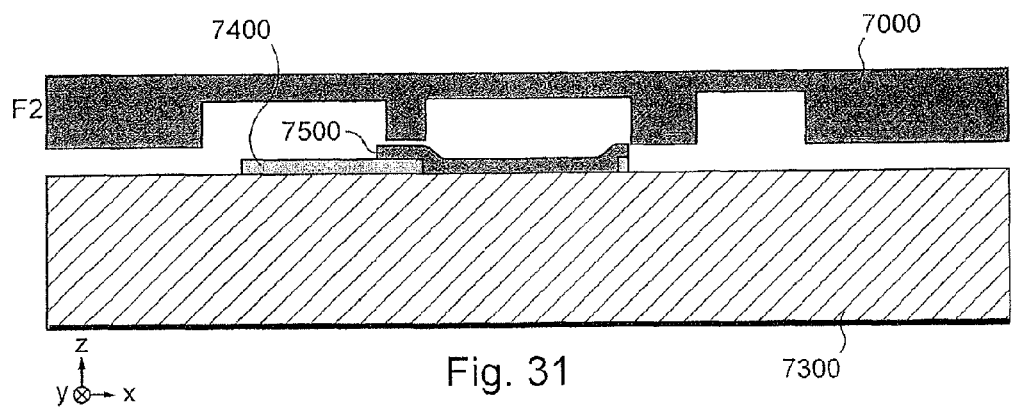

Finally, the glass plate 7300 and the silicon wafer 7000 are sealed together (step F2). The technique selected is anodic bonding, which produces chemical bonds at the interface between the glass of plate 7300 and the silicon of wafer 7000 by compressing, heating and polarizing the silicon/glass stack. The temperature can be 500° C. for a potential of the order of 1 kV. Bonding can also be carried out by other techniques such as gluing with resin, or eutectic bonding (tin-lead SnPb, gold-tin AuSn, etc.). This step is shown in FIG. 31.

Figure 32:
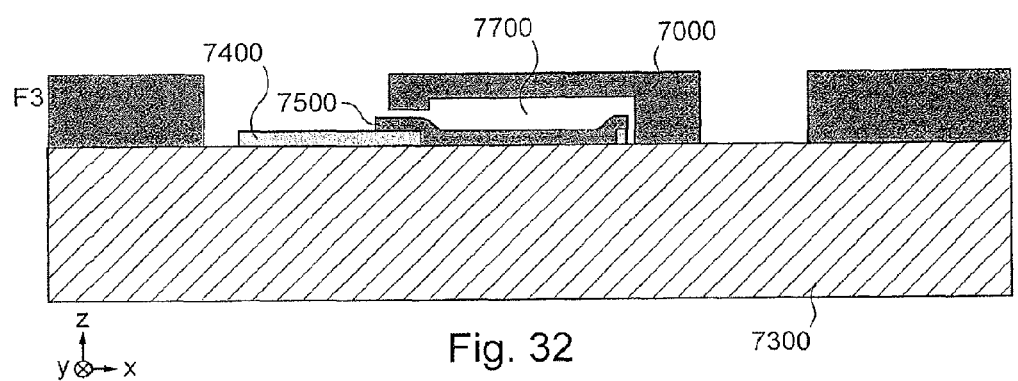

The silicon wafer 7000 is then etched in a second DRIE step (step F3) through a resin or oxide mask (not shown). This step, the result of which is shown in FIG. 32, makes it possible to finalize the tube 7700 in which the ions will travel (perpendicularly to the plane of the figure) and isolate the parts of the spectrometer that must be isolated. By way of example, the focusing lens (reference 1200 in FIG. 18) is constituted by silicon rings placed on glass separated by a space of the order of 1 mm for example. Importantly, the electrode remains accessible from outside the tube, while the resistive film 7500 is essentially buried.

A last metal deposit is then produced to form coating electrodes 7600 around the tube of the spectrometer. In the example, a so-called "lift-off" technique is used for structuring the deposit. The result of this last step is shown in FIG. 33.

At this stage, an integrated assembly is obtained, carried by a support consisting of the glass plate 7300. This collective fabrication makes it possible to manufacture a batch comprising a large number of spectrometers in the form of chips. The "spectrometer" chips are then cut out.

Figure 33:
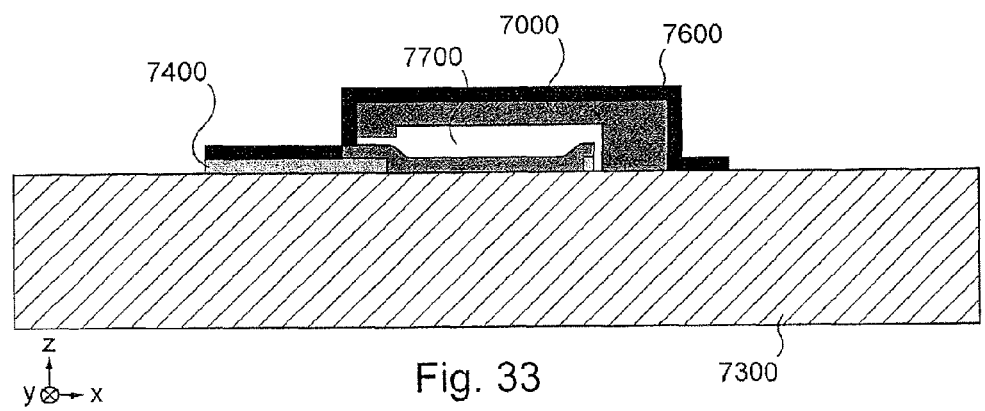

The electrodes 7400 and 7600 are polarized to the same potential in the plane of FIG. 33. Another two electrodes 7400 and 7600, in a second plane, parallel to that of FIG. 33 but displaced relative to the latter, are polarized to a second potential. The potentials are transmitted to the resistive film 7500 and to the silicon mass 7000, respectively. The resistive film 7500, which is very thin, and the surface portion (inside the device) of the silicon mass 7000, create an electric field in cavity 7700, and a potential gradient develops between the plane of FIG. 33 and the parallel plane displaced relative to the latter. This makes it possible to obtain acceleration in the tube shown. In the zone forming the reflectron, the potential difference can be established between the right and left electrodes, a continuous potential gradient being obtained between these right and left electrodes.

As a variant, the glass plate 7300 can be replaced with a silicon plate. In this case a high-resistivity silicon substrate is preferred, so that the electrodes 7400 are not short-circuited. Moreover, plates 7000 and 7300 can be bonded together by a silicon/silicon "direct bonding" technique, ensuring a seal of high strength. The last step of DRIE etching of the silicon, between FIGS. 31 and 32, can also be replaced with etching with potassium hydroxide (KOH).

In general, the fabrication methods are thus based on volume etching technologies (DRIE, KOH, or etching with tetramethylammonium hydroxide TMAH). Deep etching of a substrate makes it possible to define the cavity in which the ions travel and are subjected to the electrostatic field of the reflectron.

Alternatively, deep etching can be used for volume structuring of a stencil, which is then used for one or more steps of thick deposition for defining the walls of the reflectron. Once the stencil is removed, the cavity of the reflectron appears between these walls.

In the various embodiments, the steps of bonding of plates can be replaced with a fabrication method by chip to chip transfer.

In all of the embodiments presented, the wall of resistive material forming the reflectron is flush with the surface of a substrate or of a stack based on a substrate serving as support during certain fabrication steps, or once the device is assembled. The wall is exposed in the cavity serving as the flight zone of the ions, in which it creates an electrostatic field.

In variants that are not shown, the wall of resistive material can also be embedded in the substrate or in a stack based on the substrate, for example under a layer or a volume of material with permittivity close to that of a vacuum or of air, or of small thickness. It then creates an electrostatic field both in the layer or the volume of material with permittivity close to that of a vacuum or of air and in the cavity serving as the flight zone of the ions.

In all these variants, the wall is integrated with the volume of a substrate.

To summarize, the methods of fabrication presented permit miniaturization of the time-of-flight spectrometer and of its reflectron. Thus, the time-of-flight architecture associated with the fabrication method described makes it possible to integrate the different elements of the spectrometer on a single chip, and propose a miniature device, suitable for serial manufacture and having a high resolution for extended mass ranges.

The invention is not limited to the embodiments presented and includes all variants within the limits of the independent claims.

The invention claimed is:

1. A micro-reflectron for a time-of-flight mass spectrometer, the micro-reflectron comprising:
    a substrate and, integrated within an inner volume of the substrate, at least two polarization electrodes and a wall of at least one resistive material
    wherein the substrate comprises two bonded wafers, at least one of the wafers having an etched channel therein, such that the bonded wafers define a tube enclosed by the wall and the at least two polarization electrodes extending longitudinally along the tube, the tube comprising a flight zone for ions, and
    wherein the wall is polarized between the at least two polarization electrodes and generates a continuous potential gradient, the at least two polarization electrodes providing the continuous potential gradient for a reflectron and the flight zone, the at least two polarization electrodes and the wall being obtained by microelectromechanical systems (MEMS) technology comprising etching, deposition, and assembly and the micro-reflectron having a thickness in a thickness direction of less than 5 millimeters, and two characteristic lateral dimensions orthogonal to the thickness direction of less than 10 times the thickness.

2. The micro-reflectron according to claim 1, wherein the wall comprises at least one layer of resistive material on an inner surface of the tube.

3. The micro-reflectron according to claim 2, wherein the layer of resistive material is isolated from the volume of the substrate on a portion of a surface of the substrate by an insulating material.

4. The micro-reflectron according to claim 2 or claim 3, in which the volume of the substrate comprises an insulating material.

5. The micro-reflectron according to claim 1, wherein the wall comprises at least one surface portion of the inner volume of the substrate, the at least one surface portion comprising the at least one resistive material.

6. The micro-reflectron according to claim 1, wherein the electrodes that polarize the wall of the at least one resistive material are in direct contact with the wall.

7. The micro-reflectron according to claim 6, in which the at least two electrodes in direct contact with the wall are polarized at least at a distance by an external electrode via a volume of conductive material forming part of the substrate.

8. The micro-reflectron according to claim 6 or claim 7, wherein the at least two electrodes in direct contact with the wall have ends that are accessible from outside the reflectron, the reflectron including a cover, and wherein the at least two electrodes are polarized at least by the ends that are accessible from outside.

9. The micro-reflectron according to claim 1, wherein the wall comprises one of titanium nitride, amorphous silicon, polysilicon, germanium or metal oxide.

10. A mass spectrometer comprising a micro-reflectron according to claim 1, and further comprising an ionization source generating ions and an injection device for injection and acceleration of the ions towards the micro-reflectron, the injection device being obtained by microelectromechanical systems (MEMS) technology on the same substrate as the micro-reflectron.

11. The mass spectrometer according to claim 10, wherein the injection device is arranged such that the injection of ions towards the micro-reflectron is orthogonal relative to an ion path at an exit of the ionization source.

12. The mass spectrometer according to claim 10 or claim 11, wherein the injection device comprises a resistive wall polarized by the at least two electrodes which are separated from the wall by a volume of a conductive material.

13. The mass spectrometer according to claim 10 further comprising a detector at an exit of the micro-reflectron, and in which the ionization source and the detector are produced by the technology of microelectromechanical systems on the same substrate.

14. The mass spectrometer according to claim 10, wherein the ionization source is manufactured by volumetric machining in the technology of microelectromechanical systems, and comprises an electron attracting grid and an electrode assembly constituting an ionization chamber, for attracting or repelling ions that are formed, the ionization source being formed on the same substrate as the micro-reflectron.

15. A method for fabricating a micro-reflectron comprising:
    wet etching or deep reactive ionic etching at least one two wafers to form a portion of a flight zone for ions;
    depositing an electrode material on the flight zone;
    depositing a layer of at least one resistive material; and
    sealing the two wafers together to form a tube comprising the flight zone, the sealing comprising one of direct bonding, eutectic bonding, anodic bonding, or gluing with resin, the tube having a wall formed by the layer of the at least one resistive material and the electrode material,
    wherein the electrode material comprises polarization electrodes extending along the tube.

16. The method according to claim 15 further comprising after sealing the two substrates, forming electrodes on opposite outer surfaces of the substrates.

17. The method according to claim 15 further comprising etching the opposite outer surfaces of the wafers to form the reflectron.

18. The method according to claim 15 wherein depositing the layer of at least one resistive material comprises epitaxial deposition.

19. The method according to claim 15 further comprising depositing a layer of insulative material before depositing the layer of at least one resistive material.

20. The micro-reflectron according to claim 1, wherein the at least two polarizing electrodes are located on the wall in proximity to an interface between the two bonded wafers.

21. The micro-reflectron according to claim 2, wherein the at least two polarizing electrodes are spaced apart by the at least one layer of resistive material.

22. The micro-reflectron according to claim 21 further comprising external electrodes that generate a potential gradient in the tube through the at least one resistive material.

23. A micro-reflectron for a time-of-flight mass spectrometer, the micro-reflectron comprising:
- a substrate comprising two bonded plates, at least one of the plates having an etched channel therein, such that the bonded plates define a channel therebetween enclosed by an inner wall of resistive material and two polarization electrodes extending longitudinally along the channel and spaced apart on the inner wall in proximity to an interface between the two bonded plates, the tube comprising a flight zone for ions,
- wherein the inner wall is polarized between the at least two polarization electrodes and generates a continuous potential gradient for a reflectron and the flight zone, and
- wherein the micro-reflectron has a thickness in a thickness direction of the substrate of less than 5 millimeters, and two characteristic lateral dimensions orthogonal to the thickness direction of less than 10 times the thickness.

* * * * *